United States Patent
Cho

(10) Patent No.: US 8,048,799 B2
(45) Date of Patent: Nov. 1, 2011

(54) METHOD FOR FORMING COPPER WIRING IN SEMICONDUCTOR DEVICE

(75) Inventor: Kweng-Rae Cho, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 53 days.

(21) Appl. No.: 12/635,538

(22) Filed: Dec. 10, 2009

(65) Prior Publication Data

US 2010/0164113 A1    Jul. 1, 2010

(30) Foreign Application Priority Data

Dec. 31, 2008 (KR) .................. 10-2008-0137642

(51) Int. Cl.
*H01L 21/4763* (2006.01)

(52) U.S. Cl. ... 438/648; 438/685; 438/687; 156/345.16; 257/762; 257/763; 257/E23.145; 257/E21.577; 257/E21.585

(58) Field of Classification Search .................. 438/648, 438/685, 687; 156/345.16; 257/762, 763, 257/E23.145, E21.577, E21.585

See application file for complete search history.

(56) References Cited

U.S. PATENT DOCUMENTS 7,736,474 B2 * 6/2010 Kurashina et al. ............ 204/223

* cited by examiner

*Primary Examiner* — Tu-Tu Ho
(74) *Attorney, Agent, or Firm* — Sherr & Vaughn, PLLC

(57) ABSTRACT

A method for forming copper wirings in a semiconductor device may include depositing a lower insulating film over a semiconductor substrate; forming vias in the lower insulating film; depositing tungsten over the entire surface of upper portion of the lower insulating film so that the vias are gap-filled with the tungsten; forming tungsten plugs by performing a tungsten chemical mechanical polishing process to remove excess tungsten deposited over the upper portion of the lower insulating film; removing the tungsten remaining over the upper portion of the lower insulating film by performing a tungsten etchback process; depositing an upper insulating film over the upper portion of the lower insulating film; exposing upper portions of the tungsten plugs by forming trenches on the upper insulating film; depositing copper over the entire surface of the upper insulating film so that the trenches are gap-filled with the copper; and planarizing the copper over the upper portion of the trenches.

11 Claims, 6 Drawing Sheets

METHOD FOR FORMING COPPER WIRING IN SEMICONDUCTOR DEVICE

The present application claims priority under 35 U.S.C. 119 to Korean Patent Application No. 10-2008-0137642 (filed on Dec. 31, 2008), which is hereby incorporated by reference in its entirety.

BACKGROUND

In connection with the ongoing reduction in the size of semiconductor devices, the cross section of metal wirings is being reduced, and thus current density increases. This causes a severe problem of low reliability in metal wirings due to electromigration (EM). Accordingly, copper, which has excellent reliability as well as a lower specific resistance than aluminum, may be used for the material in metal wirings.

However, copper wirings cannot be fabricated using a dry etching process, due to difficulty in producing highly-volatile compounds. Therefore copper wirings are mainly produced using a damascene process. Hereinafter, a related single damascene process will be described with reference to the accompanying drawings.

Figure 1A:
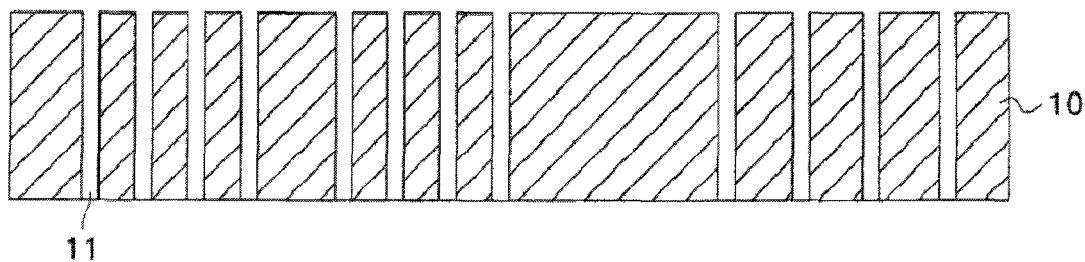

FIGS. 1A to 1F are sectional views for individual steps in a related single damascene process. First, as shown in FIG. 1A, a lower insulating film 10 may be deposited over upper portion of a semiconductor substrate. The lower insulating film 10 may be selectively etched to form vias 11.

Figure 1B:
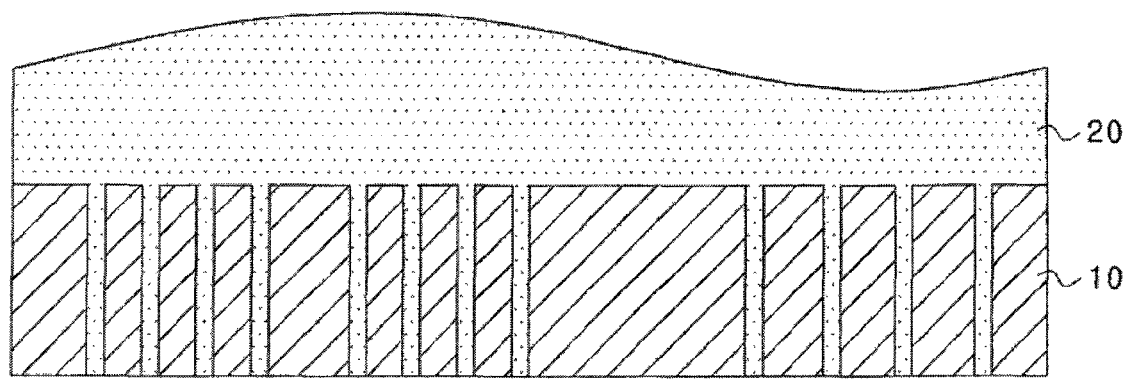

Next, as shown in FIG. 1B, tungsten 20 may be deposited over the entire surface of the lower insulating film 10 and the vias 11 (shown in FIG. 1A). Thereafter, as shown in FIG. 1C, tungsten plugs 21 may be formed by performing a chemical mechanical polishing (CMP) process to remove tungsten 20 excessively deposited over the lower insulating film 10.

Figure 1C:
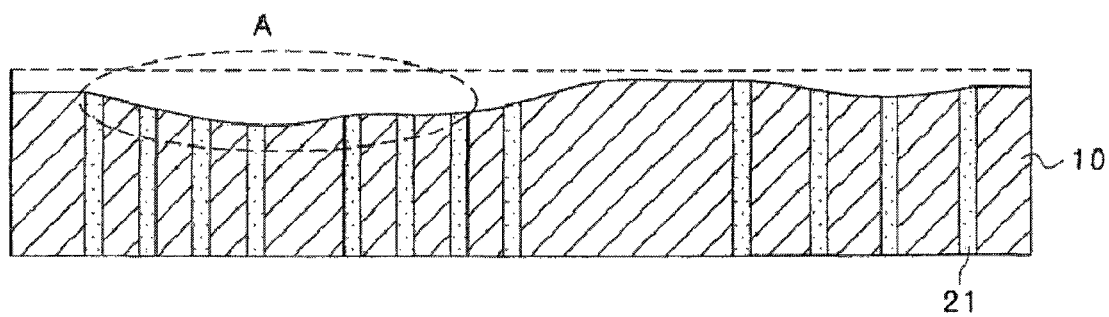
Figure 1D:
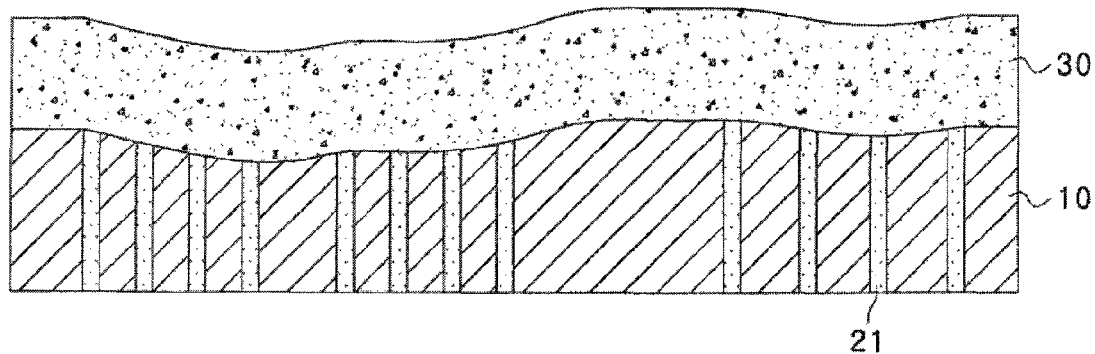
Figure 1E:
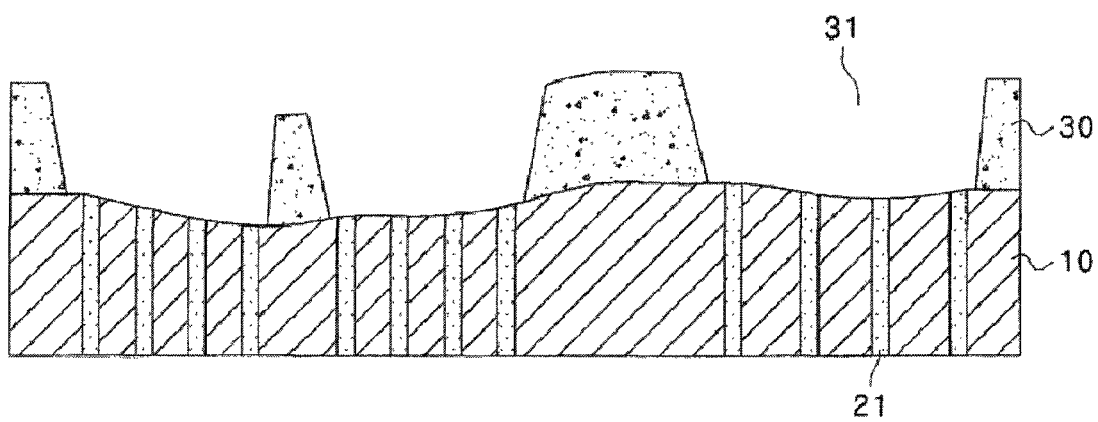

As shown in FIG. 1D, an upper insulating film 30 may be deposited over the entire surface of upper portion of the lower insulating film 10. Next, as shown in FIG. 1E, the upper insulating film 30 may be selectively etched to form trenches 31.

Figure 1F:
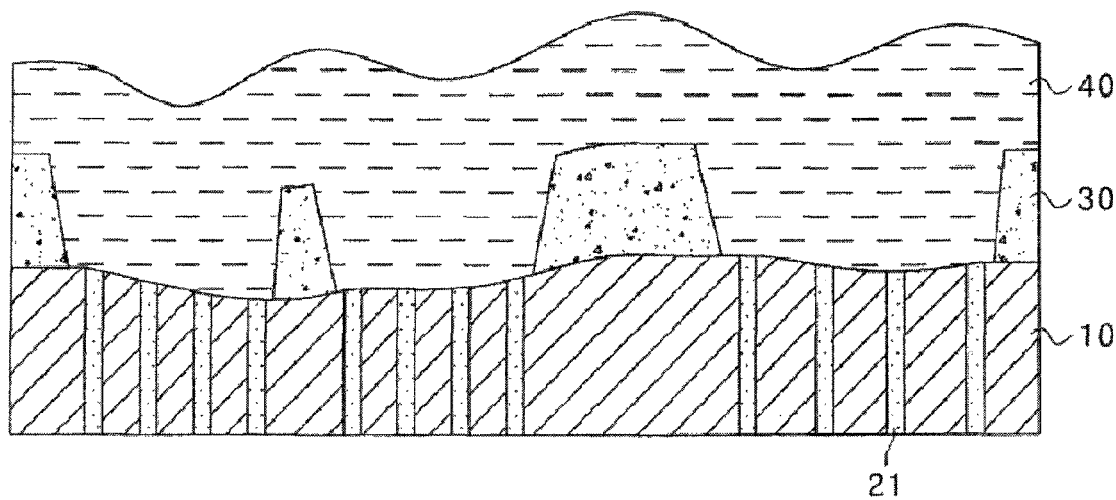
Figure 1G:
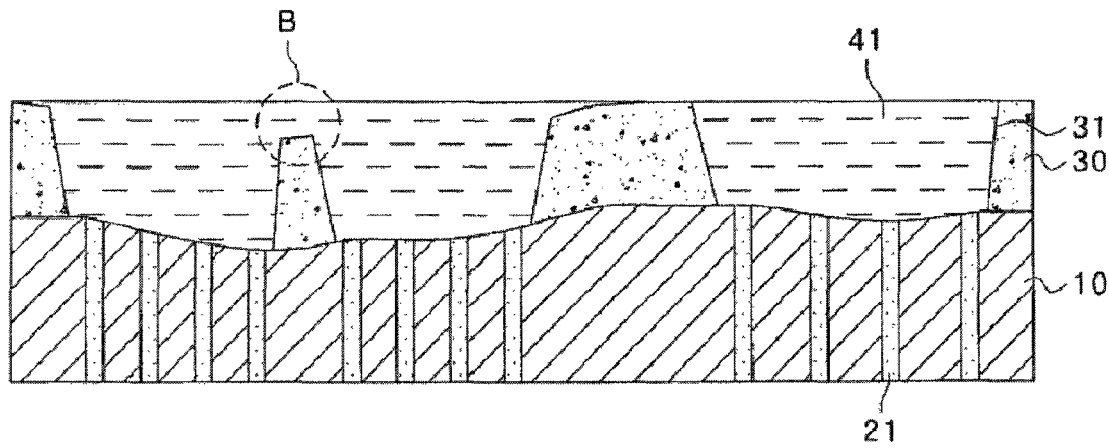

As shown in FIG. 1F, copper 40 may be deposited over the entire surface of the upper insulating film 30 and the trenches 31. Next, as shown in FIG. 1G, copper wirings 41 may be formed by performing a CMP process to planarize the upper surface of the trenches 31.

In the above steps, as shown in FIG. 1C, while over-polishing is carried out to completely remove tungsten excessively deposited over the upper portion of the lower insulating film 10, the over-polishing may etch the lower insulating film 10. In this case, the lower insulating film 10 may be more etched in an area A, having higher pattern density, than in an area having lower pattern density (which is called "pattern density effect"). As a result, as shown in FIG. 1G, a short-circuit B may develop between copper wirings adjacent to the area A having the higher pattern density.

In addition, when the lower insulating film is etched, the tungsten plugs are more polished than the lower insulating film since the tungsten plugs have a higher polishing rate than that of the lower insulating film. This causes another problem, of poor contact between the tungsten plugs and the copper wirings during formation of the copper wirings. This is called "dishing".

SUMMARY

Embodiments relate to a method for forming copper wirings in a semiconductor device, and more particularly, to a method for forming copper wirings in a semiconductor device, which is capable of preventing short-circuit between copper wirings in a single damascene process for forming the copper wirings.

Embodiments relate to a method for forming copper wirings in a semiconductor device, which may include: depositing a lower insulating film over a semiconductor substrate; forming vias in the lower insulating film; depositing tungsten over the entire surface of upper portion of the lower insulating film so that the vias are gap-filled with the tungsten; forming tungsten plugs by performing a tungsten chemical mechanical polishing process to remove excess tungsten deposited over the upper portion of the lower insulating film; removing the tungsten remaining over the upper portion of the lower insulating film by performing a tungsten etchback process; depositing an upper insulating film over the upper portion of the lower insulating film; exposing upper portions of the tungsten plugs by forming trenches on the upper insulating film; depositing copper over the entire surface of the upper insulating film so that the trenches are gap-filled with the copper; and planarizing the copper over the upper portion of the trenches.

The lower insulating film may acts as a polishing stopper. The tungsten chemical mechanical polishing process may immediately stop polishing when the lower insulating film is detected. The lower insulating film may be detected using an optical endpoint detector.

The tungsten etchback process may be performed in a fluorine-family gas atmosphere. The fluorine-family gas may be $ClF_3$, or $NF_3$. Over-etching in a range of 3% to 5% may be performed during the tungsten etchback process.

The trenches may be formed over the upper insulating film by performing a reactive ion etching process. Depositing tungsten over the entire surface of upper portion of the lower insulating film is carried out using high density plasma chemical vapor deposition.

Embodiments relate to an apparatus configured to: deposit a lower insulating film over a semiconductor substrate; form vias in the lower insulating film; deposit tungsten over the entire surface of upper portion of the lower insulating film so that the vias are gap-filled with the tungsten; form tungsten plugs using a tungsten chemical mechanical polishing process to remove excess tungsten deposited over the upper portion of the lower insulating film; remove the tungsten remaining over the upper portion of the lower insulating film using a tungsten etchback process; deposit an upper insulating film over the upper portion of the lower insulating film; expose upper portions of the tungsten plugs by forming trenches on the upper insulating film; deposit copper over the entire surface of the upper insulating film so that the trenches are gap-filled with the copper; and planarize the copper over the upper portion of the trenches.

DRAWINGS

FIGS. 1A to 1G are sectional views for individual steps in a related single damascene process.

Example FIGS. 2A to 2H are sectional views for individual steps in a single damascene process according to embodiments.

DESCRIPTION

Example FIGS. 2A to 2H are sectional views for individual steps in a single damascene process according to embodiments. First, as shown in example FIG. 2A, vias 110 may be formed in a lower insulating film 100. The lower insulating film 100 may be deposited over a semiconductor substrate, and may be an inter-metal dielectric, a pre-metal dielectric, undoped silicate glass (USG), fluorinated silicate glass (FSG), phospho-silicate glass (PSG) or borophospho-silicate glass (BPSG).

A barrier metal may be deposited over the entire surface of the lower insulating film 100 and the vias 110. The barrier metal may be formed as a Ti/TiN multilayer structure. The barrier metal may facilitate adhesion of tungsten deposited in the vias in a subsequent process, and may prevent tungsten from being diffused into the lower insulating film 100. If the lower insulating film 100 is a pre-metal dielectric, silicide (TiSi$_2$) may be formed through bonding of Ti to silicon, and thus contact resistance between contact plugs and a drain/source region can be reduced.

Figure 2A:
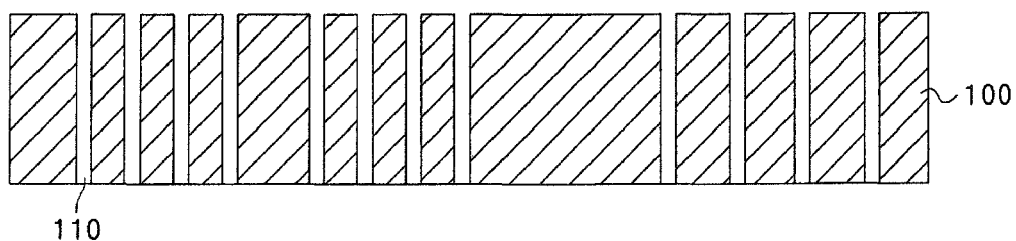
Figure 2B:
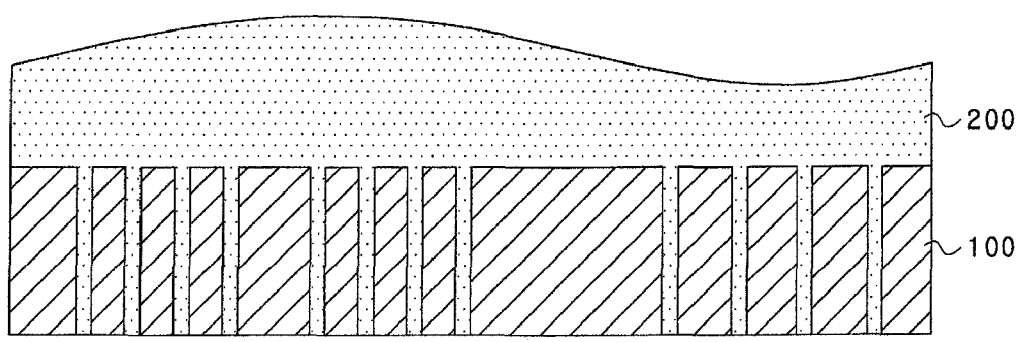

Next, as shown in example FIG. 2B, tungsten 200 may be deposited over the entire surface of upper portion of the lower insulating film 100 and the vias 110 (as shown in example FIG. 2A), so that the vias 110 may be gap-filled with tungsten 200. The gap-fill may be carried out using high density plasma chemical vapor deposition (HDPCVD).

Figure 2C:
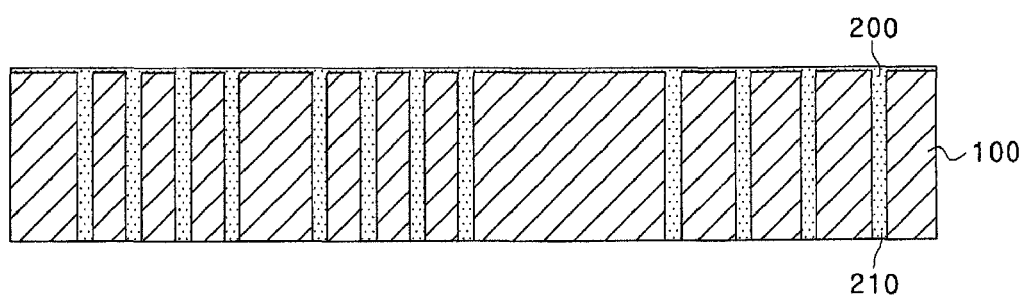
Figure 2D:
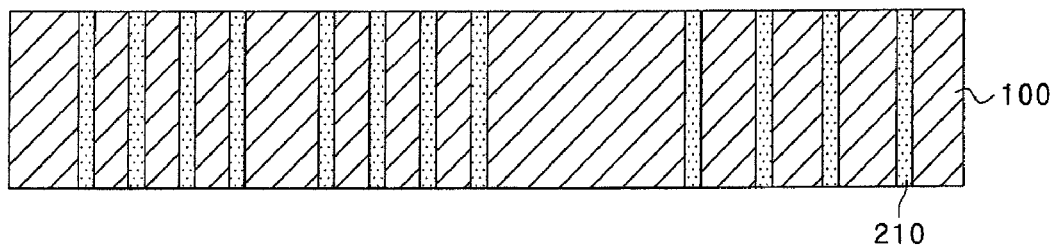

Next, as shown in example FIG. 2C, tungsten 200 excessively deposited over the upper portion of the lower insulating film 100 may be removed by performing a tungsten CMP (Chemical Mechanical Polishing) process. The lower insulating film 100 acts as a polishing stopper in the tungsten CMP process. The polishing is carried out under an under-polishing condition. That is, when the lower insulating film 100, acting as the polishing stopper, is detected during the tungsten CMP process, the polishing may be immediately stopped. The polishing stopper may be detected using an optical endpoint detector.

However, when the polishing is carried out using the under-polishing condition, tungsten may remain over the upper portion of the lower insulating film 100. Then, as shown in example FIG. 2D, tungsten plugs 210 may be formed by performing a tungsten etchback process to remove tungsten 200 remaining over the upper portion of the lower insulating film 100. The tungsten etchback process may be carried out under an atmosphere of fluorine-family gas such as ClF$_3$ or NF$_3$.

During the tungsten etchback process, over-etching may be carried out to completely remove tungsten remaining over the upper portion of the lower insulating film 100. In this regard, only 3 to 5% over-etching may be carried out in order to minimize loss of the upper portion of the tungsten plugs 210, which may be caused by the over-etching.

Figure 2E:
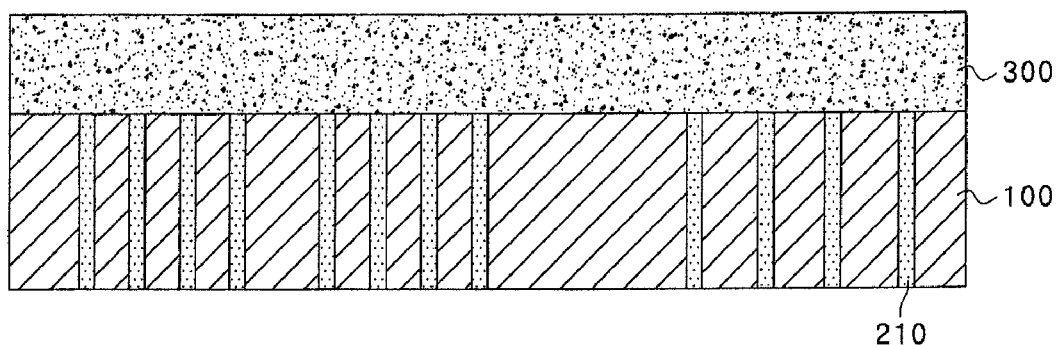

Next, as shown in example FIG. 2E, an upper insulating film 300 may be deposited over the upper portion of the lower insulating film 100. The upper insulating film 300 may be deposited by a chemical vapor deposition method, which may include USG, FSG, PSG or BPSG, similar to the formation of the lower insulating film 100.

Figure 2F:
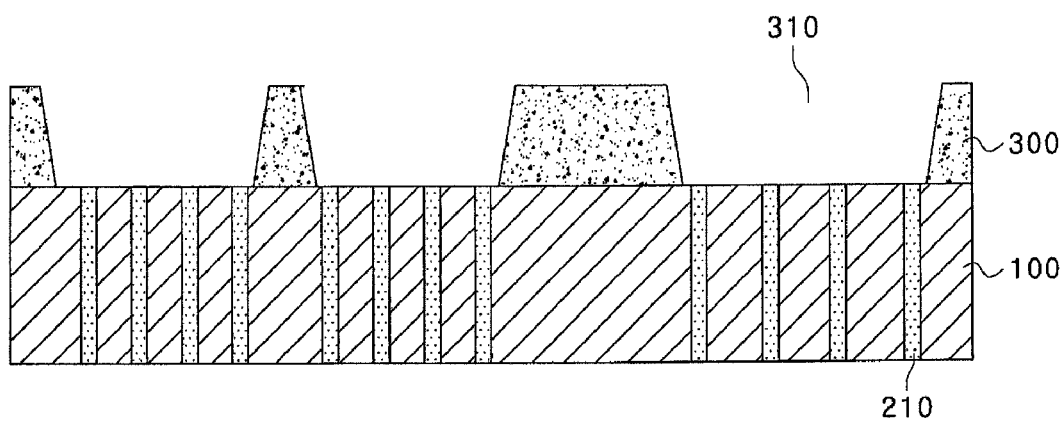

Next, as shown in example FIG. 2F, the upper portion of the tungsten plugs 210 may be exposed by forming trenches 310 on the upper insulating film 300 using an etching process. The trenches 310 may be etched by a reactive ion etch (RIE) process.

Figure 2G:
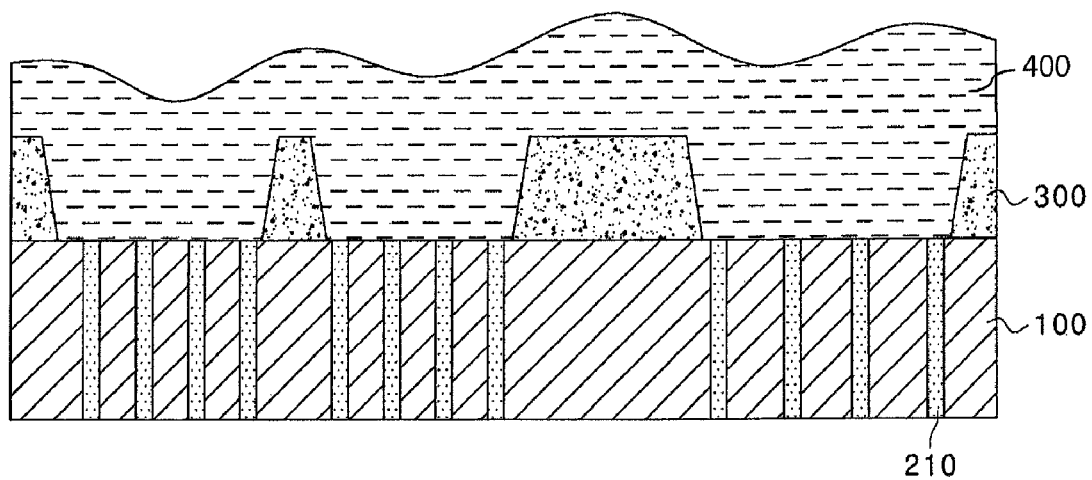

Next, as shown in example FIG. 2G, copper 400 may be deposited over the entire surface of the upper insulating film 300, so that the trenches 310 (shown in example FIG. 2F) may be gap-filled with copper 400. The copper deposition may include a step of forming a copper seed layer and a step of filling with copper. The copper seed layer may be formed using physical vapor deposition or chemical vapor deposition. Copper filling may be achieved using chemical vapor deposition, electroplating or the like.

Figure 2H:
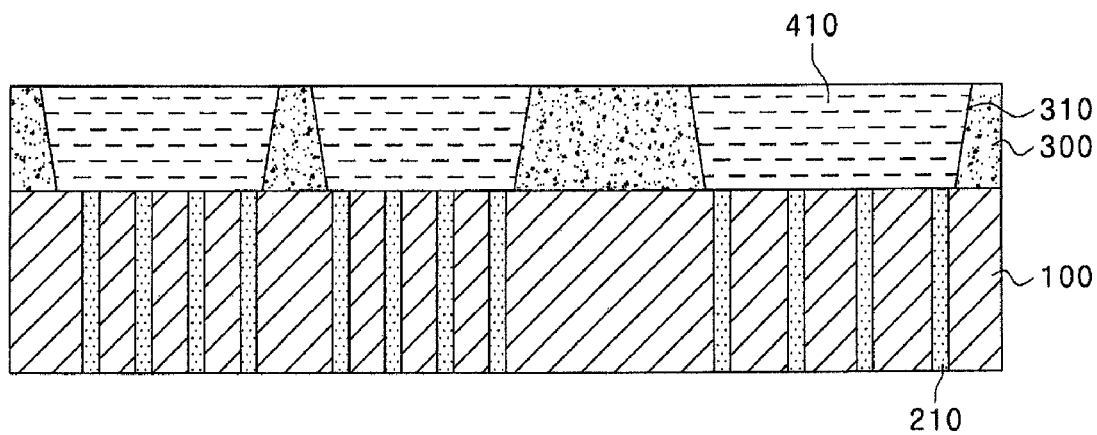

Finally, as shown in example FIG. 2H, copper 400 may be planarized over the upper surface of the trenches 310, thereby forming copper wirings 410. Here, the planarization may be carried out by a CMP process.

According to embodiments, the method for forming copper wiring in a semiconductor device is capable of preventing a short-circuit between copper wirings in a single damascene process for forming the copper wiring. In addition, it is possible to minimize loss of an upper portion of tungsten plugs during formation of the tungsten plugs.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   depositing a lower insulating film over a semiconductor substrate;
   forming vias in the lower insulating film;
   depositing tungsten over the entire surface of upper portion of the lower insulating film so that the vias are gap-filled with the tungsten;
   forming tungsten plugs by performing a tungsten chemical mechanical polishing process to remove excess tungsten deposited over the upper portion of the lower insulating film;
   removing the tungsten remaining over the upper portion of the lower insulating film by performing a tungsten etchback process;
   depositing an upper insulating film over the upper portion of the lower insulating film;
   exposing upper portions of the tungsten plugs by forming trenches on the upper insulating film;
   depositing copper over the entire surface of the upper insulating film so that the trenches are gap-filled with the copper; and
   planarizing the copper over the upper portion of the trenches.

2. The method of claim 1, wherein the tungsten chemical mechanical polishing process immediately stops polishing when the lower insulating film is detected.

3. The method of claim 1, wherein the lower insulating film acts as a polishing stopper.

4. The method of claim 3, wherein the lower insulating film is detected using an optical endpoint detector.

5. The method of claim 1, wherein the tungsten etchback process is performed in a fluorine-family gas atmosphere.

6. The method of claim 5, wherein the fluorine-family gas is ClF$_3$.

7. The method of claim 5, wherein the fluorine-family gas is NF$_3$.

8. The method of claim 1, wherein over-etching in a range of 3% to 5% is performed during the tungsten etchback process.

9. The method of claim 1, wherein the trenches are formed over the upper insulating film by performing an etching process.

10. The method of claim 1, wherein the trenches are formed over the upper insulating film by performing a reactive ion etch process.

11. The method of claim 1, wherein depositing tungsten over the entire surface of upper portion of the lower insulating film is carried out using high density plasma chemical vapor deposition.

* * * * *